United States Patent
Dydyk et al.

(10) Patent No.: US 8,222,118 B2
(45) Date of Patent: Jul. 17, 2012

(54) WAFER BACKSIDE GRINDING WITH STRESS RELIEF

(75) Inventors: Mark Dydyk, Cave Creek, AZ (US); Arturo Urquiza, Chandler, AZ (US); Charles Singleton, Mesa, AZ (US); Tim McIntosh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/335,378

(22) Filed: Dec. 15, 2008

(65) Prior Publication Data

US 2010/0151678 A1    Jun. 17, 2010

(51) Int. Cl.
*H01L 21/46* (2006.01)
*H01L 21/30* (2006.01)

(52) U.S. Cl. ......... 438/459; 438/690; 438/693; 438/750
(58) Field of Classification Search .................. None
See application file for complete search history.

(56) References Cited

U.S. PATENT DOCUMENTS

| | | | |
|---|---|---|---|
| 5,882,539 A * | 3/1999 | Hasegawa et al. | 216/88 |
| 6,184,064 B1 * | 2/2001 | Jiang et al. | 438/113 |
| 6,245,677 B1 * | 6/2001 | Haq | 438/690 |
| 6,927,167 B2 * | 8/2005 | Fukuda et al. | 438/689 |
| 6,940,367 B2 * | 9/2005 | Ma et al. | 333/187 |
| 7,064,069 B2 * | 6/2006 | Draney et al. | 438/690 |
| 7,259,458 B2 * | 8/2007 | Su et al. | 257/713 |
| 7,338,904 B2 * | 3/2008 | Koyata et al. | 438/692 |
| 7,767,563 B2 * | 8/2010 | Li | 438/572 |

* cited by examiner

*Primary Examiner* — Zandra Smith
*Assistant Examiner* — Khanh Duong
(74) *Attorney, Agent, or Firm* — Blakely, Sokoloff, Taylor & Zafman LLP

(57) ABSTRACT

A method of relieving stress in a semiconductor wafer and providing a wafer backside surface finish capable of hiding cosmetic imperfections. Embodiments of the invention include creating a wafer backside surface which can be used for all dies on the semiconductor wafer intended for different product applications and be deposited with backside metallization (BSM) material. The method provides a rough texture on the wafer backside followed by isotropic etching of the wafer backside to recover the wafer strength as well as to preserve the rough texture of the wafer backside. After wafer backside metallization, the rough texture of the wafer backside hides cosmetic imperfections introduced by subsequent processes.

18 Claims, 4 Drawing Sheets

WAFER BACKSIDE GRINDING WITH STRESS RELIEF

BACKGROUND OF INVENTION

1. Field

The present invention relates to semiconductor wafer process, and more specifically semiconductor wafer backside grinding.

2. Discussion of Related Art

Wafer backside grinding (BSG) is conventionally employed to reduce the original thickness of semiconductor wafer after device fabrication and passivation. The profile of a wafer is reduced to a desired thickness suitable for assembling dies (obtained after wafer singulation step) on substrate packages. Backside grinding may induce subsurface damage and intrinsic stress to the wafer. Wafer backside is polished to remove the subsurface damage and to recover the wafer strength from earlier induced stress. However a smooth die backside makes cosmetic defects introduced during subsequent processes such as assembly and test on the die backside surface more pronounced. Dies with visible cosmetic defects are typically rejected and cause low yield.

A semiconductor wafer may include dies of various performance specifications catered for different product lines and market segments. A wafer may undergo different wafer preparation process steps depending upon, for example, the end products the dies are to be assembled. Hence, some dies on a wafer may need to be discarded and cause lower yield if the demand for the particular end product is low.

Examples are presented to illustrate the points in above paragraph. Wafers from fabrication plants may or may not undergo backside metallization (BSM) process step depending on the product demand of certain dies obtained from the wafers. Backside metallization on wafer backside enables a lower thermal junction-to-case resistance ($R_{\theta JC}$) to be attained. Dies intended for high-end applications typically undergo backside metallization. No touch-up of the wafer backside, such as smooth backside grinding, may be required as typically the backside of the dies will not be visible to end users. Instead, solder thermal interface material (STIM) may be applied on the backside of dies for high-end applications to provide low thermal junction-to-case resistance.

On the other hand, backside metallization may not be required for some wafers. Dies obtained from wafers without backside metallization are typically intended for middle and lower end applications. Wafers not subject to backside metallization process step may undergo backside grinding such as smooth grinding or wafer thinning before undergoing wafer preparation steps. Polymeric thermal interface material (PTIM) may be applied to the die backside and will result in higher thermal junction-to-case resistance relative to STIM.

DETAILED DESCRIPTION OF ILLUSTRATED EMBODIMENTS

Embodiments of the present invention relate to a method of treating the backside of semiconductor wafers. The method creates a wafer backside surface which can be used for all dies on the wafer intended for different product applications and be deposited with BSM material. The method provides a rough texture on the wafer backside followed by isotropic etching of the wafer backside to recover the wafer strength as well as to preserve the rough texture of the wafer backside. After wafer backside metallization, the rough texture of the wafer backside hides cosmetic imperfections introduced by subsequent processes.

Reference throughout the specification to "one embodiment" or "an embodiment" means that a particular feature, structure, characteristic or step described in connection with the embodiment is included in at least one embodiment of the present invention. Thus, the appearance of said phrases in various places throughout the specification does not necessarily all refer to the same embodiment unless otherwise expressed. Furthermore, the particular features, structures, characteristics or steps recited in the specification may be combined in any suitable manner in one or more embodiments.

Figure 1A:
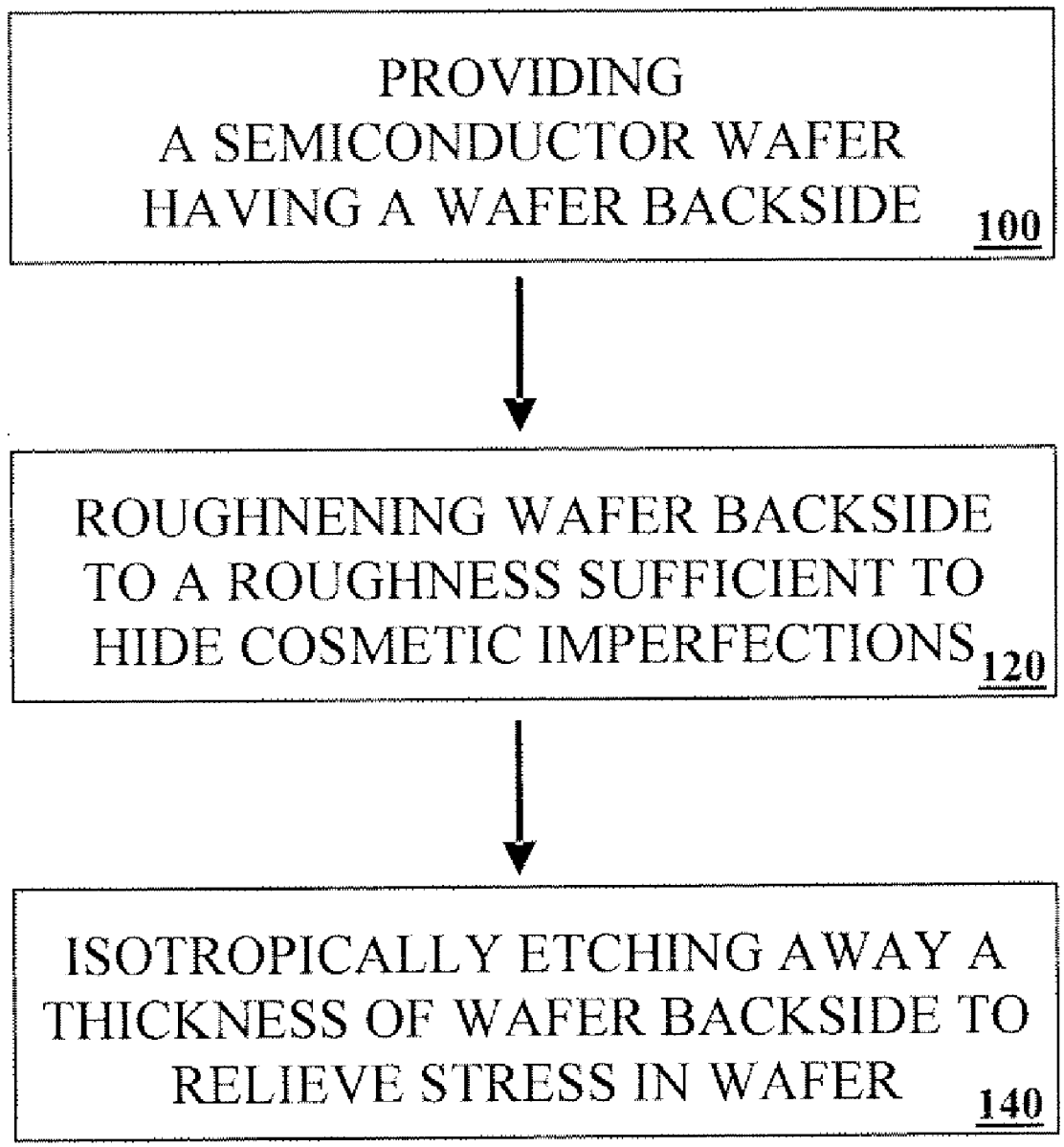
FIG. 1A illustrates a flowchart of an embodiment of the invention.

FIG. 1A illustrates a flowchart according to an embodiment of the invention. In step 100, a semiconductor wafer having a wafer backside is provided. Next in step 120, the wafer backside is roughened to create a surface texture sufficient to hide cosmetic imperfections on the wafer backside. Following roughnening of the wafer backside, the wafer backside is isotropically etched to relieve the semiconductor wafer from intrinsic stress as illustrated in step 140. Details of steps 100, 120 and 140 will be explained in the following paragraphs.

Figure 1B:
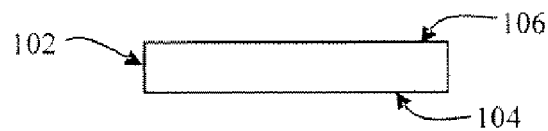
FIGS. 1B to 1H illustrate the process steps involved in making an embodiment of the invention.

FIG. 1B to FIG. 1H illustrate the method involved in making an embodiment of the invention. Referring to FIG. 1B, semiconductor wafer 102 is provided. Wafer 102 may be made of semiconductor material such as silicon, silicon germanium and gallium arsenide. Wafer 102 includes wafer frontside 104 and wafer backside 106. Wafer frontside 104 includes fabricated devices and passivation layers. Wafer backside 106 forms bulk of the thickness of wafer 102. In an embodiment, wafer 102 may be a thick wafer having original thickness between 700 and 800 µm. In another embodiment, wafer 102 may be a thin wafer having original thickness of less than 700 µm. In an embodiment, wafer backside 106 may have a relatively smooth surface. However, embodiments of the invention do not preclude processing wafer 102 having an initially rough surface on wafer backside 106.

Figure 1C:
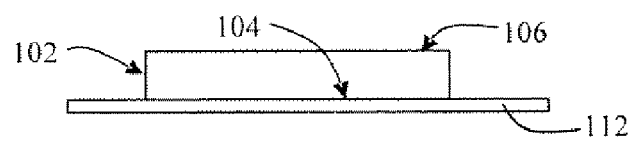
Figure 1D:
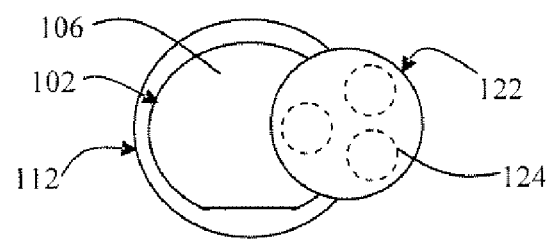
Figure 1E:
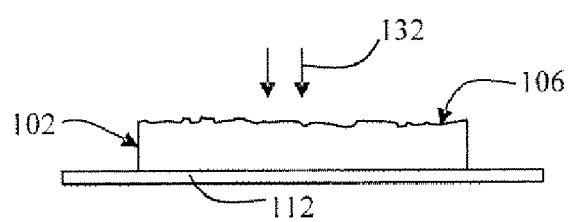

First, wafer 102 may be laminated with a backgrind adhesive tape to prepare for subsequent process steps. FIG. 1C illustrates wafer frontside 104 being laminated with adhesive tape 112. Adhesive tape 112 protects wafer 102 from damage during wafer backside processing. In particular, adhesive tape 112 protects wafer frontside 104 against contamination of grinding liquids as well as assists handling of wafer 102 during backside processing. In an embodiment, adhesive tape 112 may be an ultra-violet (UV)-cure type adhesive layer formed on a thermoplastic support tape. An UV-cure adhesive may include acrylate monomers resin. The support tape may be made from a polymer such as polyolefin, polyvinyl or polyethylene.

In an embodiment, after laminating wafer 102 with adhesive tape 112, wafer 102 may be subjected to wafer backside rough grinding to create a rough texture on wafer backside 106. In another embodiment, wet texture etching may also be used to produce a rough wafer backside finish. FIG. ID illustrates a top view of grinding wheel 122 grinding wafer backside 106. In an embodiment, grinding wheel 122 may include abrasive 124 of graded grit size between 200 and 2000. In an embodiment where wafer 102 is a thick wafer with original thickness between 700 and 800 μm, 30-775 μm thick of wafer backside 106 material may be ground away to produce a thinned wafer. In another embodiment where it is intended to maintain wafer 102 having a thick profile, a depth of 10-30 μm of wafer backside 106 may be removed. In an embodiment where wafer 102 initially is a thin wafer with thickness less than 700 μm, a depth of 10-675 μm of wafer backside 106 material may be removed during the wafer backside rough grinding. In an embodiment, grinding wheel 122 may be set with spindle rotational speed in the range of 3000-5000 and chuck table rotational speed in the range of 200-300 rpm and grinding rate between 0.1 and 5.0 μm/s.

Figure 2:
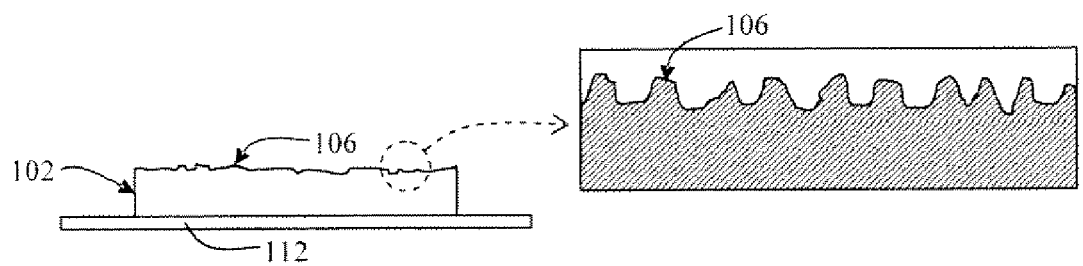
FIG. 2 illustrates a magnified cross sectional view of a wafer backside after being roughened according to an embodiment of the invention.

Upon completion of backside rough grind step 120, the surface of wafer backside 106 would have attained a rough texture. Referring to FIG. 2, a magnified view of the surface of wafer backside 106 at microscopic level is illustrated. In an embodiment, the surface of wafer backside 106 is roughened to a rough texture sufficient to hide cosmetic defects on wafer backside 106. In an embodiment, the $R_a$ value of wafer backside 106 after wafer backside rough grinding is 10-100 times the $R_a$ value before rough grinding. Surface roughness, $R_a$ values represent the arithmetic average of the absolute values of the roughness profile ordinates and are as defined according to ASME Y14.36M-1996 standard. In an embodiment, surface roughness, $R_a$ of wafer backside 106 after wafer backside rough grinding may range between 0.1 and 1.0 μm. In another embodiment, wafer backside 106 may be directly wet etched without undergoing rough backside grinding. In an embodiment, surface roughness, $R_a$ of wafer backside 106 after wet etching may be as much as 30 times surface roughness, $R_a$ of wafer backside 106 prior to wet etching. In an embodiment, surface roughness, $R_a$ of wafer backside 106 after wet etching is 0.05-0.30 μm.

After rough backside grinding, wafer 102 is prepared for subsequent process steps. In an embodiment where adhesive tape 112 laminating wafer frontside 104 of wafer 102 is an UV-cure type, adhesive tape 112 may first be irradiated with UV light before backside isotropic etching step 140. Referring back to FIG. 1E, wafer 102 laminated with adhesive tape 112 may be exposed to UV light 132. When adhesive tape 112 is exposed to UV light 132, chemicals of the adhesive material of adhesive tape 112 are cured and moisture is driven out of adhesive tape 112. The tackiness between adhesive tape 112 and wafer 102 is reduced.

Rough backside grinding to create a rough texture on wafer backside 106 may collaterally introduce subsurface microcracks and intrinsic stress in wafer 102. Microcracks and intrinsic stress make wafer 102 brittle. Wafer 102 may crack during transportation or wafer singulation or dies (obtained after wafer singulation) may crack during downstream processes if microcracks and stress in wafer 102 are left untreated. It is therefore desirable to recover the wafer strength after rough backside grinding by removing microcracks and stress present in wafer 102. Meanwhile, it is also desired that the rough texture of surface of wafer backside 106 to be preserved so that the texture may be sufficiently rough to hide defects appearing on the surface of wafer backside 106.

Figure 1F:
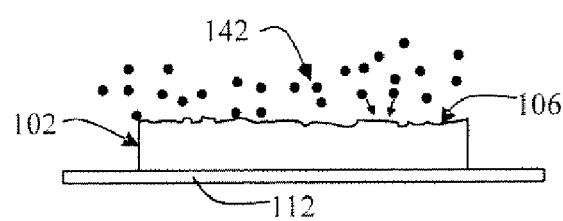
Figure 3:
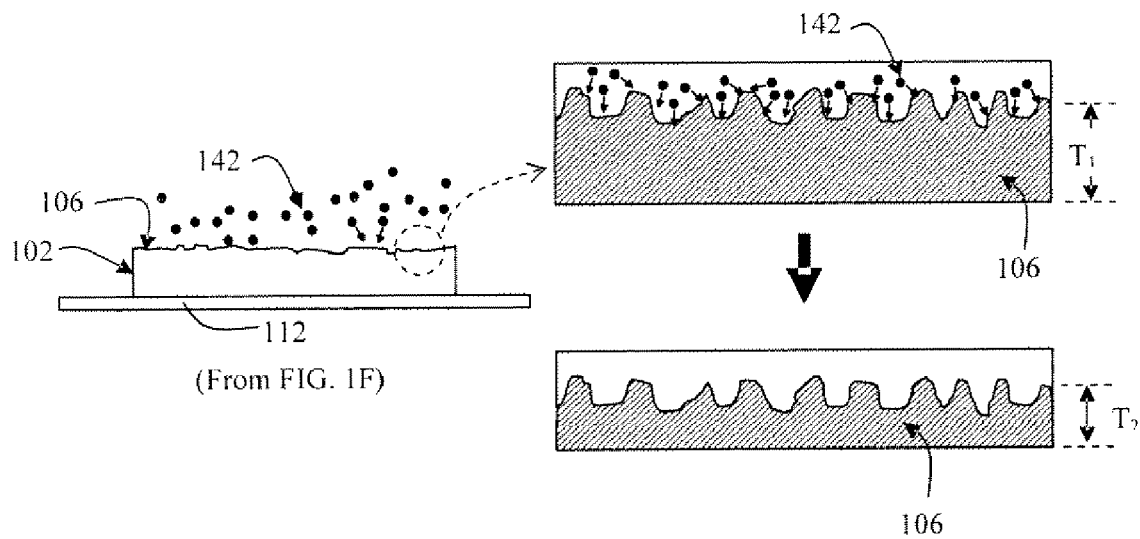
FIG. 3 illustrates a magnified cross sectional view of a wafer backside after being isotropically etched according to an embodiment of the invention.
Figure 4:
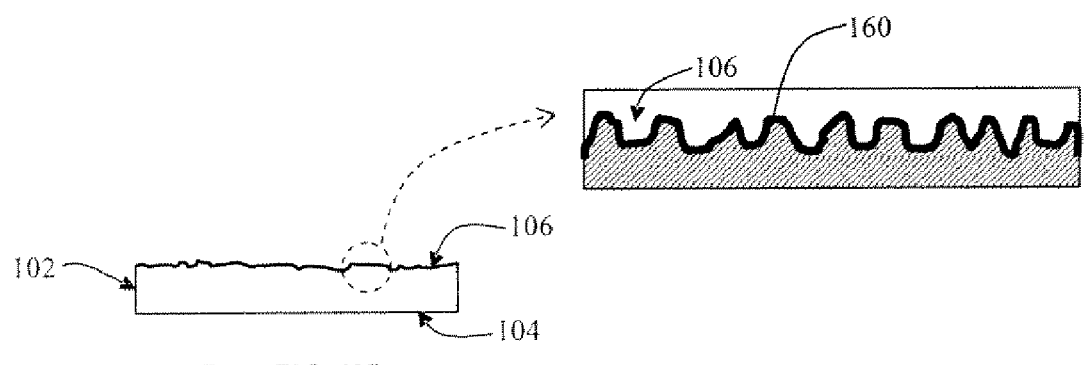
FIG. 4 illustrates a magnified cross sectional view of a wafer backside after being metallized according to an embodiment of the invention.

In an embodiment, isotropic etching may be employed to recover the strength of wafer 102 and to preserve the rough texture of the surface of wafer backside 106. In an embodiment, wafer backside isotropic etching may be performed after UV irradiation. FIG. 1F illustrates isotropic etching particles 142 etching the surface of wafer backside 106. Isotropic etching particles 142 etch the surface of wafer backside 106 in all directions and at the same rate, hence preserving the rough texture of the surface of wafer backside 106 as well as removing subsurface microcracks induced during rough backside grind step 120. Referring now to FIG. 3, FIG. 3 illustrates magnified views of etching particles 142 isotropically etching the rough surface of wafer backside 106 at microscopic level. For illustrative purpose, wafer backside 106 has an initial thickness $T_1$ before isotropic etching. FIG. 3 further illustrates that, upon completion of isotropic etching, roughness of the surface of wafer backside 106 is being preserved while a certain depth of wafer backside 106 has been etched away. The thickness of wafer backside 106 after isotropic etching is reduced to post-isotropic etching thickness $T_2$. The difference between initial thickness $T_1$ and post-isotropic etching thickness $T_2$ represents the amount of wafer backside 106 material removed by isotropic etching. In an embodiment, the thickness of wafer backside 106 removed during isotropic etching may range between 3-25 μm. In an embodiment, the rough texture of the surface of wafer backside 106 after isotropic etching is still sufficiently rough to hide cosmetic defects that may be introduced on wafer backside 106 subsequently. In an embodiment, the surface roughness, $R_a$ values of wafer backside 106 after isotropic etching may be 20-150% of surface roughness, $R_a$ of wafer backside 106 immediately after rough backside grinding. In another embodiment, the surface roughness, $R_a$ values of wafer backside 106 after isotropic etching may range from 0.1 to 1.0 μm. In an embodiment, the surface of wafer backside 106 may be etched to a depth sufficient to remove subsurface microcracks and relieve wafer 102 from intrinsic stress induced during rough backside grinding. In an embodiment, 50-100% of the original strength of wafer 102 before undergoing rough backside grinding may be recovered upon wafer backside isotropic etching.

In another embodiment of the invention, wafer backside 106 may also be isotropically etched by way of isotropic plasma etching. In an embodiment, the plasma reactant gas may include sulfur hexafluoride ($SF_6$) or carbon fluoride ($CF_4$). In an embodiment, isotropic plasma etching may be carried out in an etch chamber operated in the range of 2-5 torr, 25-70° C. and 2-4 kW. In another embodiment, wafer backside 106 may be isotropically etched by way of isotropic wet etching. In an embodiment, a mixture of etching chemical solution comprising hydrofluoric acid (HF), nitric acid ($HNO_3$) and sulfuric acid ($H_2SO_4$) may be used for wet etching. In an embodiment, the mixture of hydrofluoric acid, nitric acid and sulfuric acid may be in the ratio of 1:1:8. In an embodiment, isotropic wet etching may be carried out by immersion technique. Wafer 102 may be immersed in etching chemical solution maintained in the range of 25-45° C. for 1-60 seconds. In another embodiment, wafer 102 may be isotropically wet-etched by way of spin-spray technique. Wafer 102 may be placed on a platform spun at 400-480 rpm and continuously prayed with etching chemical solution maintained at temperature in the range of 25-45° C. on wafer backside 106 for 1-60 seconds.

Figure 1G:
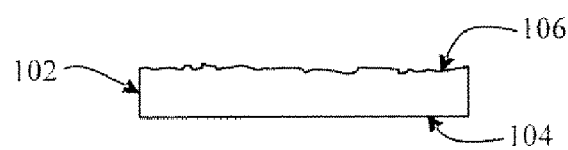
Figure 1H:
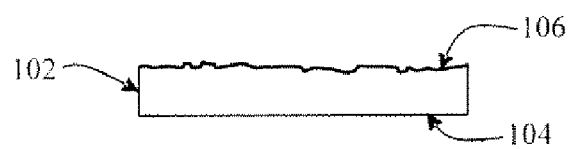

Following wafer backside isotropic etching, UV-irradiated adhesive tape 112 may be detaped as illustrated in FIG. 1F. Next, the surface of wafer backside 106 may be subjected to wafer backside metallization as illustrated in FIG. 1G. In an embodiment, the surface of wafer backside 106 may be metallized with backside metal layer 160. Backside metal layer 160 acts as a thermal interface between the backside of a die (obtained after wafer singulation step) and a heat dissipation device such as a heat sink or a heat spreader. A solder thermal interface polymer material is also typically deposited between backside metal layer 160 and the heat dissipation device. Backside metal layer 160 provides wafer 102 (as well as dies obtained after wafer singulation step) a lower junction-to-case resistance ($R_{\theta JC}$). In an embodiment, backside metal layer 160 comprises layers of different metals. In an embodiment, backside metal layer 160 may be layers of titanium (Ti), nickel-vanadium (NiV) and gold (Au). In another embodiment, backside metal layer 160 may comprise other opaque (non-transparent) metals such as nickel-vanadium-argentum (NiVAg), nickel-vanadium-gold (NiVAu), titanium-platinum-gold (TiPtAu), gold-titanium-nickel-vanadium-argentum (AuTiNiVAg) and chromium-nickel-vanadium-argentum (CrNiVAg).

Figure 5:
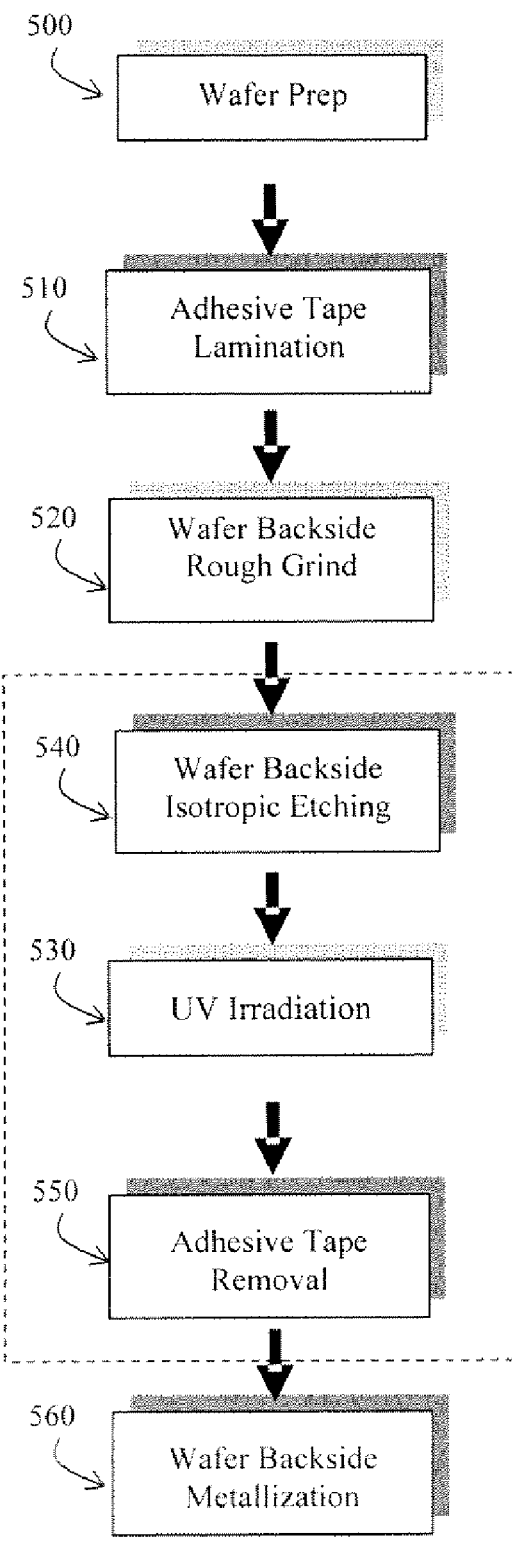
FIG. 5 and FIG. 6 illustrate different embodiments of process steps involved in making an embodiment of the invention.
Figure 6:
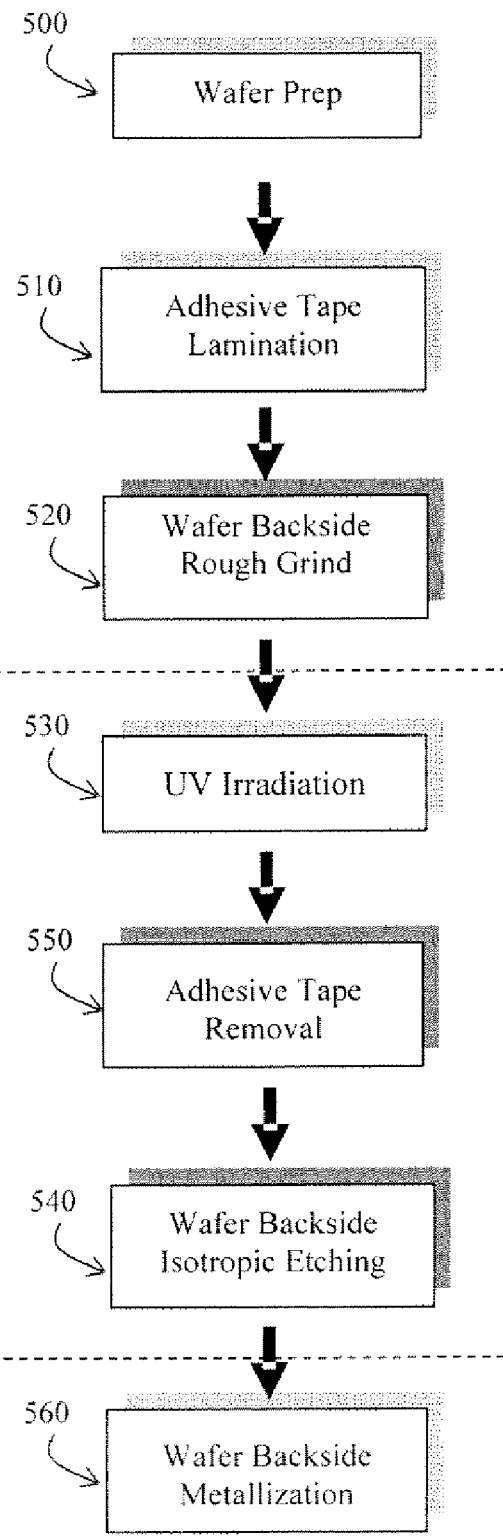

Other embodiments may include sequence of process steps different from the sequence of process steps illustrated in FIG. 1B to FIG. 1H. In an embodiment as illustrated in FIG. 5, immediately after wafer backside rough grinding (step 120), wafer backside isotropic etching (step 140) follows. Subsequently, adhesive tape 112 may be UV-irradiated (step 130) and removed (step 150). In another embodiment as illustrated in FIG. 6, immediately after wafer backside rough grinding (step 120), adhesive tape 112 may first be UV-irradiated (step 130) and removed (step 150) and then followed by wafer backside isotropic etching (step 140).

Embodiments described above provide semiconductor wafers to recover the silicon fracture strength as well as to hide cosmetic imperfections subsequently introduced. Rough grinding to create a rough texture on the surface of wafer backside followed by isotropic etching provides full recovery of the wafer fracture strength. Common die pool is enabled to provide all wafers with backside metallization and without requiring backside surface touch-up.

What is claimed is:

1. A method of processing a semiconductor wafer, comprising:
    providing a semiconductor wafer having a wafer backside, wherein the wafer backside has a surface roughness;
    roughening the wafer backside to increase the surface roughness;
    isotropically etching away 3-25 µm of the thickness of the wafer backside while preserving the surface roughness, wherein the isotropically etching-relieves stress in the wafer; and
    metallizing the wafer backside with a metal layer comprising at least one of titanium (Ti), nickel-vanadium (NiV), nickel-vanadium-argentum (NiVAg), nickel-vanadium-gold (NiVAu), titanium-platinum-gold (TiPtAu), gold-titanium-nickel-vanadium-argentum (AuTiNiVAg) and chromium-nickel-vanadium-argentum (CrNiVAg).

2. The method of claim 1, further comprising roughening the wafer backside to surface roughness, $R_a$ between 0.1 and 1.0 µm.

3. The method of claim 2, further comprising roughening the wafer backside using 200-2000 grit concentration grind wheel.

4. The method of claim 3, wherein roughening the surface of the wafer backside includes removing 10-775 µm of the thickness of the wafer backside.

5. The method of claim 4, further comprising isotropically etching the wafer backside by way of isotropic plasma etching.

6. The method of claim 5, wherein the isotropic plasma etching uses one of sulfur hexafluoride ($SF_6$) and carbon tetrafluoride ($CF_4$).

7. The method of claim 5, wherein the isotropic wet etching uses a mixture of hydrofluoric acid, nitric acid and sulfuric acid.

8. The method of claim 7, wherein the mixture of hydrofluoric acid, nitric acid and sulfuric acid is in the ratio of 1:1:8.

9. The method of claim 4, further comprising isotropically etching the wafer backside by way of isotropic wet etching.

10. A method of processing a semiconductor wafer, comprising:
    providing a semiconductor wafer having a wafer backside, wherein the wafer backside has a surface roughness;
    roughening the surface of the wafer backside to increase the surface roughness;
    isotropically etching away a thickness of the wafer backside while preserving the surface roughness, wherein the isotropically etching relieves stress in the wafer and preserves rough texture of the wafer backside; and
    metallizing the wafer backside with a metal layer comprising at least one of titanium (Ti), nickel-vanadium (NiV), nickel-vanadium-argentum (NiVAg), nickel-vanadium-gold (NiVAu), titanium-platinum-gold (TiPtAu), gold-titanium-nickel-vanadium-argentum (AuTiNiVAg) and chromium-nickel-vanadium-argentum (CrNiVAg).

11. The method of claim 10, further comprising roughening the surface of the wafer backside using 200-2000 grit concentration grind wheel.

12. The method of claim 11, wherein roughening the surface of the wafer backside includes removing 10-775 µm of the thickness of the wafer backside.

13. The method of claim 12, further comprising isotropically etching the wafer backside by way of isotropic plasma etching.

14. The method of claim 13, wherein the isotropic plasma etching uses one of sulfur hexafluoride ($SF_6$) or carbon tetrafluoride ($CF_4$).

15. The method of claim 12, further comprising isotropically etching the wafer backside by way of isotropic wet etching.

16. The method of claim 15, wherein the isotropic wet etching uses a mixture of hydrofluoric acid, nitric acid and sulfuric acid.

17. The method of claim 16, wherein the mixture of hydrofluoric acid, nitric acid and sulfuric acid is in the ratio of 1:1:8.

18. A method of processing a semiconductor wafer, comprising:
    providing a semiconductor wafer having a wafer backside, wherein the wafer backside has a surface roughness;
    roughening the surface of the wafer backside to increase the surface roughness; and
    isotropically etching away a thickness of the wafer backside while preserving the surface roughness; and
    metallizing the wafer backside with a metal layer comprising at least one of titanium (Ti), nickel-vanadium (NiV), nickel-vanadium-argentum (NiVAg), nickel-vanadium-gold (NiVAu), titanium-platinum-gold (TiPtAu), gold-titanium-nickel-vanadium-argentum (AuTiNiVAg) and chromium-nickel-vanadium-argentum (CrNiVAg).

* * * * *